US012266930B1

(12) United States Patent
Karnik

(10) Patent No.: US 12,266,930 B1
(45) Date of Patent: Apr. 1, 2025

(54) MULTIDROP 1-5 V PROCESS AUTOMATION NETWORK

(71) Applicant: Endress+Hauser SE+Co. KG, Maulburg (DE)

(72) Inventor: Gautham Karnik, Whitestown, IN (US)

(73) Assignee: Endress+Hauser SE+Co. KG, Maulburg (DE)

( * ) Notice: Subject to any disclaimer, the term of this patent is extended or adjusted under 35 U.S.C. 154(b) by 24 days.

(21) Appl. No.: 18/526,128

(22) Filed: Dec. 1, 2023

(51) Int. Cl.
*H03K 5/22* (2006.01)
*H02J 3/00* (2006.01)
(52) U.S. Cl.
CPC . *H02J 3/00* (2013.01); *H03K 5/22* (2013.01)
(58) Field of Classification Search
CPC ..................................... H02J 3/00; H03K 5/22
See application file for complete search history.

(56) References Cited

U.S. PATENT DOCUMENTS

2002/0150156 A1\* 10/2002 Calvin ................ H04L 25/0266
375/258

\* cited by examiner

*Primary Examiner* — Daniel Cavallari
(74) *Attorney, Agent, or Firm* — Mark A. Logan; Endress+Hauser (USA) Holding, Inc.

(57) ABSTRACT

A process automation system includes a central controller, a four-conductor, multi-drop bus, 1 to 16 1-5 V field devices, and 1 to 16 coupler boxes, each coupler box connecting a respective field device with the bus. The central controller includes a dual-tone, multiple-frequency (DTMF) encoder and each coupler box includes a DTMF decoder. Each coupler box isolates its associated field device's 1-5 V signal from the bus unless the coupler box is addressed by the central controller via a DTMF signal.

5 Claims, 3 Drawing Sheets

MULTIDROP 1-5 V PROCESS AUTOMATION NETWORK

TECHNICAL FIELD

The present disclosure relates generally to a coupler box for a field device in an industrial process automation system.

BACKGROUND

An industrial process automation system may include a central controller (for example, a programmable logic controller, PLC) and one or more field devices. The field devices may be used for measuring something about the automated process such as a tank fill level, a mass flow through a pipe, or a temperature of a medium, for example. The field device may also be used for setting something about the process, such as, for example, a pump state (i.e., on/off), a switch state, or something similar.

For those field devices that measure a process variable (e.g., the fill level, the mass flow, the temperature, etc.), the field device may communicate the measured process variable to the central PLC via an analog signal. By way of examples, the analog signal may be an electrical current between 4 and 20 mA, inclusive, or the analog signal may be an electrical voltage between 1 to 5 V, inclusive.

In a process automation system that includes field devices communicating their respective measured values to the central PLC via an analog electrical signal, each field device must be wired directly to the central PLC. The central PLC, for its part, must have a port, an interface, dedicated to each field device that will communicate an analog electrical signal.

An example of a process automation system using 1-5 V signaling as known in the prior art is shown in FIG. 1. In FIG. 1, a central controller supplies power (VCC) and ground (GND) to each of the field devices 1–n of the process automation system. A multidrop bus may be used to supply the power (VCC) and ground (GND) to the field devices. But in addition to the power and ground signals, a direct connection is needed between each field device and the controller so that each field device may communicate its measured value to the controller via a 1-5 V analog signal. Note this 1-5 V analog signal is separate from the power connection to the field device, and the 1-5 V analog signal is not carried on the multi-drop bus. However, the ground for the 1-5 V signal may be the ground signal (GND) of the multidrop bus. As can be seen in FIG. 1, the controller must have an input port for each field device's 1-5 V analog signal.

In the 1-5 V process automation system, adding an additional, compatible field device requires of course connecting the field device with the power and ground bus, but it is necessary to run at least one conductor from the PLC to the newly added field device for the 1-5 V analog signal. The conductor must be connected with a dedicated port on the controller, and if a dedicated port is not available (because, for example, all ports are already connected with a field device), an additional module with available ports must be added to the controller. As can be seen, the addition of an additional field device to an industrial process automation system requires the time and expense of running new wires, and may additionally require the time and expense of adding additional hardware. Therefore, there remains a need in process automation systems using analog voltage signaling to reduce the time and cost of adding an additional field device to the system.

SUMMARY

Certain aspects of the present disclosure are directed to a coupler box that may include a bus-side connector including: a ground (GND) terminal; an input voltage (VCC) terminal; a 1-5 volt (V) output terminal; and a dual-tone, multiple-frequency (DTMF) input terminal. The coupler box may include a field-device side connector, including: a GND terminal; a VCC output terminal; and a 1-5 V input terminal. The coupler box may further include a first single-pole, single-throw (SPST) switch electrically disposed between the 1-5 V output terminal and the 1-5 V input terminal, wherein the first SPST switch is normally open. The coupler box may further include: a DTMF decoder having an input connected with the DTMF input terminal; a dual in-line package (DIP) switch configured to set a binary value from 0000b to 1111b, inclusive; and a comparator circuit having: a first input connected with an output of the DTMF decoder; a second input connected with the DIP switch; and an output signal connected with a control input of the first SPST switch. The comparator circuit may be configured to compare a decoded DTMF signal output by the DTMF decoder with the binary value set by the DIP switch. The comparator circuit may be further configured to assert its control output to close the first SPST switch when the decoded DTMF signal equals the binary value set by the DIP switch, thus electrically connecting the 1-5 V output terminal with the 1-5 V input terminal.

In an embodiment of the coupler box, the coupler box further includes a second SPST switch, wherein the second SPST switch is electrically disposed between the input VCC terminal and the output VCC terminal, and the second SPST switch is normally open, wherein the output signal of the comparator circuit is further connected with a control input of the second SPST switch, and wherein the comparator circuit is further configured to close the second SPST switch when the decoded DTMF signal equals the binary value set by the DIP switch, thus electrically connecting the VCC input terminal with the VCC output terminal.

Also disclosed is a process automation system, including a central controller. The central controller may include a processor and a memory; a supply voltage (VCC) output; a ground (GND) terminal; a 1-5 volt (V) signal input terminal; and a dual-tone, multiple-frequency (DTMF) encoder configured to output on a DTMF output terminal an electrical dual-tone signal encoding a value from 0 to 15. The process automation system may further include a four-conductor, multi-drop bus, wherein a first conductor of the bus is connected with the VCC output of the central controller; a second conductor of the bus is connected with the GND terminal of the central controller; a third conductor of the bus is connected with the 1-5 V input terminal of the central controller; and a fourth conductor of the bus is connected with the DTMF output terminal of the central controller.

The process automation system may further include a first coupler box that may include a bus-side connector including: a ground (GND) terminal; an input voltage (VCC) terminal; a 1-5 volt (V) output terminal; and a dual-tone, multiple-frequency (DTMF) input terminal. The coupler box may include a field-device side connector, including: a GND terminal; a VCC output terminal; and a 1-5 V input terminal. The coupler box may further include a first single-pole, single-throw (SPST) switch electrically disposed between the 1-5 V output terminal and the 1-5 V input terminal, wherein the first SPST switch is normally open. The coupler box may further include: a DTMF decoder having an input connected with the DTMF input terminal; a dual in-line package (DIP) switch configured to set a binary value from 0000b to 1111b, inclusive; and a comparator circuit having: a first input connected with an output of the DTMF decoder; a second input connected with the DIP switch; and an output signal connected with a control input of the first SPST switch. The comparator circuit may be configured to compare a decoded DTMF signal output by the DTMF decoder with the binary value set by the DIP switch. The comparator circuit may be further configured to assert its control output to close the first SPST switch when the decoded DTMF signal equals the binary value set by the DIP switch, thus electrically connecting the 1-5 V output terminal with the 1-5 V input terminal.

The bus-side GND terminal of the coupler box may be connected with the second conductor of the bus, the bus-side VCC terminal may be connected with the first conductor of the bus, the 1-5 V output terminal may be connected with the third conductor of the bus, and the DTMF input terminal may be connected with the fourth conductor of the bus.

The process automation system may further include a first field device, including: a VCC input; a GND terminal; and a 1-5 V signal output terminal, wherein the VCC input is connected with VCC output terminal of the first coupler box, the GND terminal is connected with the bus-side GND terminal of the first coupler box, and the 1-5 V signal output terminal is connected with the 1-5 V input terminal of the first coupler box.

The central controller of the process automation system may be configured to output a DTMF signal via the DTMF output terminal, wherein the central controller may be further configured to input a 1-5 V signal from the first field device by outputting a DTMF signal that matches an address of the first coupler box encoded by the DIP switch of the first coupler box; and reading the 1-5 V signal from the third conductor of the bus.

In an embodiment, the process automation system may further include a second coupler box embodied identically to the first coupler box, wherein the bus-side GND terminal of the second coupler box is connected with the second conductor of the bus, the bus-side VCC terminal of the second coupler box is connected with the first conductor of the bus, the 1-5 V output terminal of the second coupler box is connected with the third conductor of the bus, and the DTMF input terminal of the second coupler box is connected with the fourth conductor of the bus. The process automation system may include a second field device, including a VCC input; a GND terminal; and a 1-5 V signal output terminal, wherein the VCC input of the second field device is connected with VCC output terminal of the second coupler box, the GND terminal of the second field device is connected with the bus-side GND terminal of the second coupler box, and the 1-5 V signal output terminal of the second field device is connected with the 1-5 V input terminal of the second coupler box. An address encoded by the DIP switch of the second coupler box may differ from the address encoded by the DIP switch of the first coupler box. The central controller may be further configured to input a 1-5 V signal from the second field device by outputting a DTMF signal that matches the address encoded by the DIP switch of the second coupler box; and reading the 1-5 V signal from the third conductor of the bus.

In an embodiment of the process automation system, the first coupler box further includes a second single-pole, single-throw (SPST) switch, wherein the second SPST switch is electrically disposed between the VCC input terminal and the VCC output terminal, wherein the second SPST switch is normally open, wherein the output signal of the comparator circuit is further connected with a control input of the second SPST switch, and wherein, after outputting the DTMF signal that matches the address encoded by the DIP switch of the first coupler box; the central controller is further configured to wait for the first field device to power up before the central controller reads the 1-5 V signal from the third conductor of the bus.

DETAILED DESCRIPTION

Figure 1:
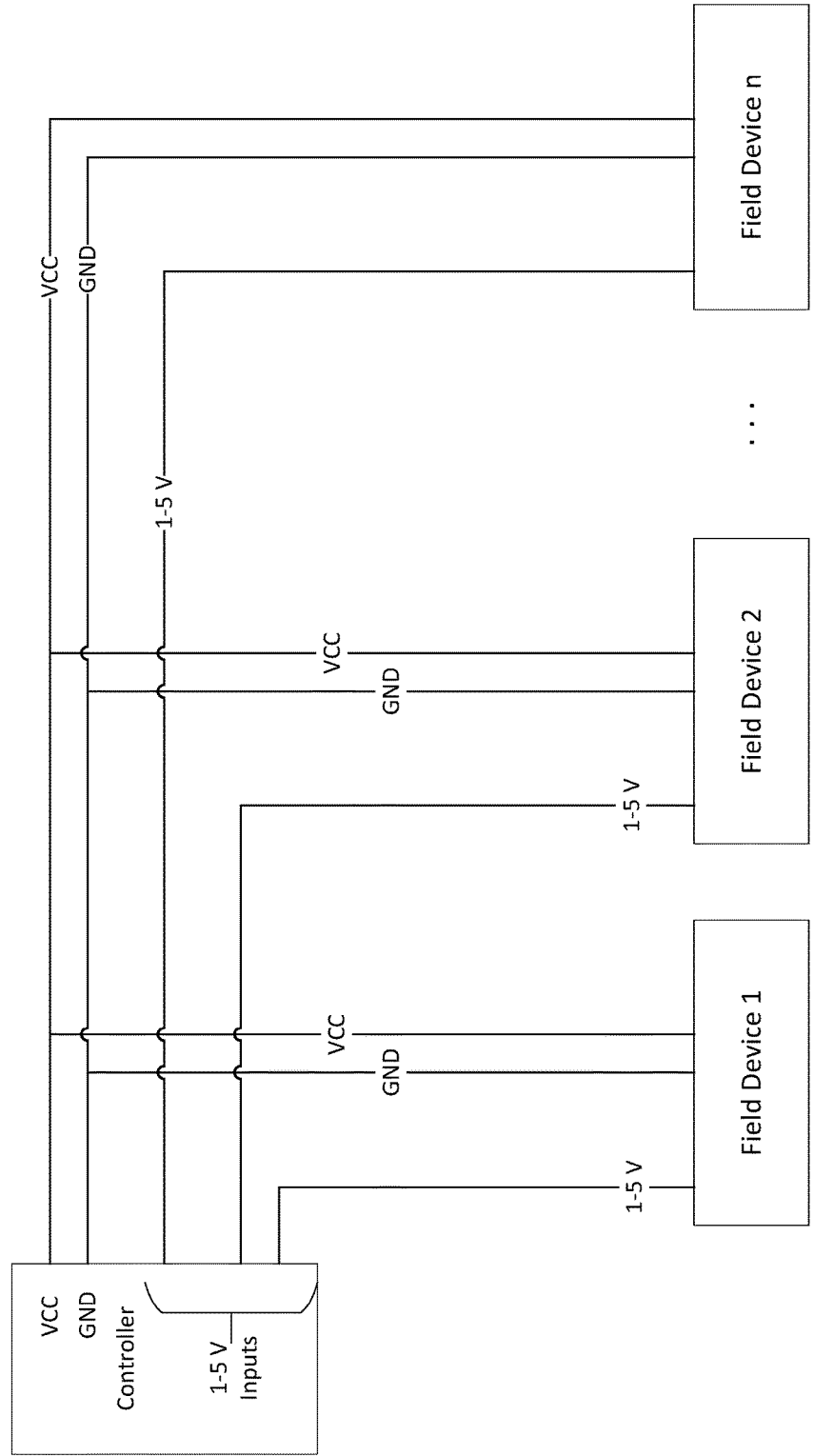
FIG. 1 shows a 1-5 V process automation system as known in the art.
Figure 2:
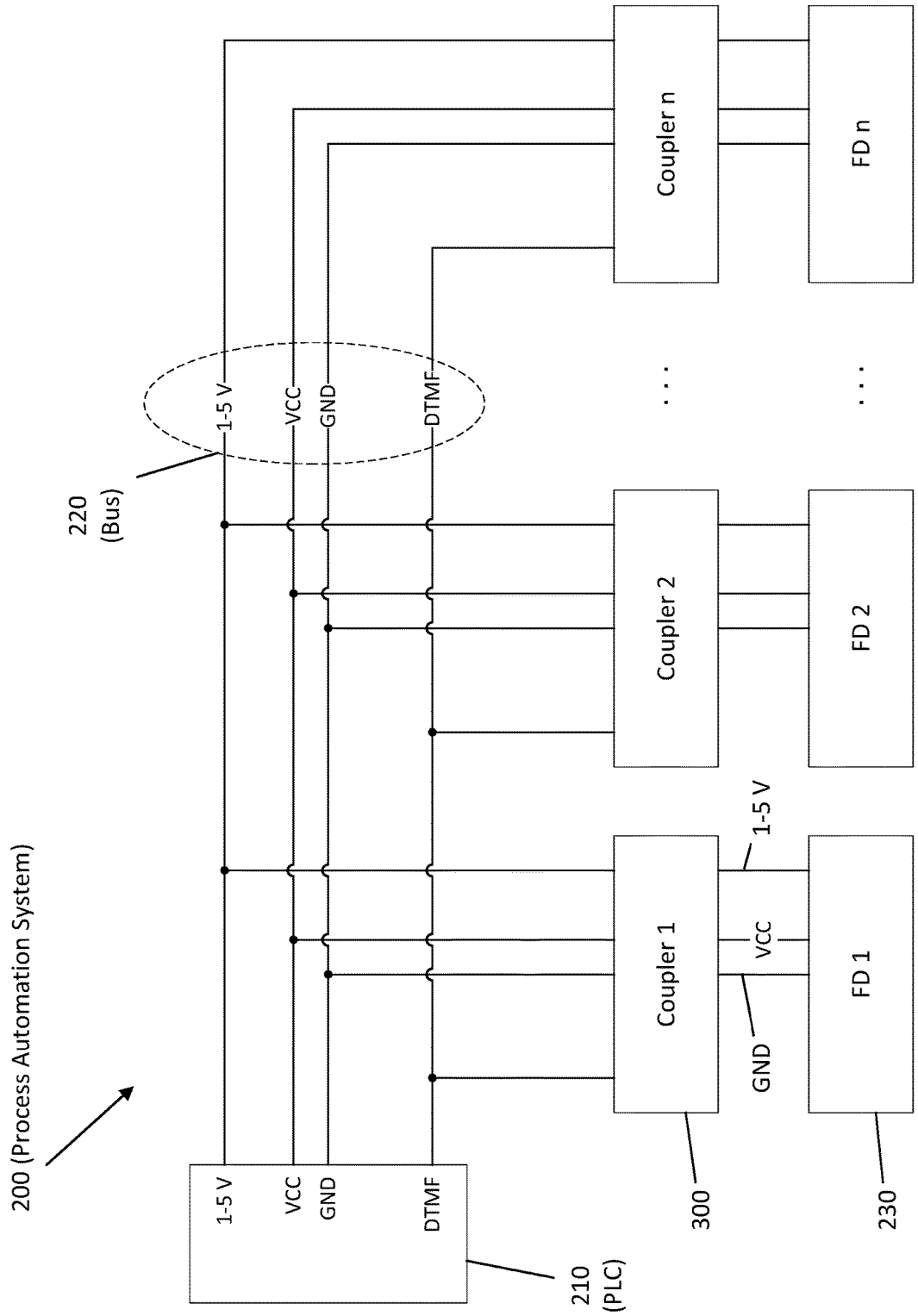
FIG. 2 shows a process automation system according to an embodiment of the present disclosure.

An example embodiment of a 1-5 V process automation system 200 according to the present disclosure is shown in FIG. 2. The process automation system 200 may include a programmable logic controller (PLC) 210; a four-conductor multidrop bus 220; one or more coupler boxes 300; and one or more field devices 230. Each field device 230 is connected with a coupler box 300, and each coupler box 300 is connected with the bus 220. Therefore, each field device 230 is connected with the PLC 210 via a coupler box 300 and the bus 220.

The PLC 210 according to the present disclosure may be in many respects a PLC as known in the art. The PLC 210 may include a power supply to provide electrical power to the one or more coupler boxes 300 and thus to the one or more field devices 230; the PLC 210 may include input ports to receive from the one or more field devices 230 a 1-5 V analog signal that encodes a value of a process variable; and the PLC 210 may include a central processing unit (CPU/µCU) or other computing unit to execute measured value processing or other control logic. But additionally, the PLC 210 according to the present disclosure may include a dual-tone multiple-frequency (DTMF) encoder embodied to transmit a dual-tone, multiple-frequency audio signal on a line of the bus 220.

A DTMF encoder as known in the art is a device embodied to produce and electrically transmit two separate audible tones simultaneously. Each of the two audible tones has a frequency chosen from eight possible audible frequencies, and the two audible tones will not both be of the same frequency. Four of the eight audible frequencies may be considered column frequencies that identify a column in a four-column matrix. The remaining four audible frequencies may be considered row frequencies that identify a row in a four-row matrix. Thus the transmission by the DTMF encoder of a dual-tone signal may identify by column and row a unique cell in a four-by-four matrix. Or stated in another manner, the dual-tone signal of the DTMF encoder may represent a unique number from 1 to 16, or, for programmers, from 0 to 15.

Note in the present disclosure the DTMF signal is an oscillating electrical signal having a frequency in the audible frequency range.

As shown in FIG. 2, the bus 220 according to the present disclosure may be a simple, four-conductor, multi-drop bus as known in the art. Such a four-conductor bus may be that used in typical RS-485 application, for example.

According to an embodiment of the current disclosure, one conductor of the bus 220 may carry an operating voltage, VCC; a second conductor of the bus 220 may provide a signal ground, GND; a third conductor of the bus 220 may carry a DTMF signal generated by DTMF encoder of the PLC 210; and a fourth conductor of the bus 220 may be configured to carry a 1-5 V analog electrical signal from a field device to the PLC. Note both the DTMF signal and the 1-5 V analog signal are with respect to the common GND signal. As can be seen in the exemplary process automation system 200 of FIG. 2, this fourth conductor of the bus 220, carrying the 1-5 V analog signal, may include connections with one or more coupler boxes 300.

Indeed this is an advantage of the couple box 300 and the process automation system 200 of the present disclosure. The coupler box 300 enables the connection of many (from 1 to 16) 1-5 V process automation field devices to a single 1-5V input of the PLC 210.

The coupler box 300 is designed to keep the analog signal of an individual field device isolated from the multidrop bus (and thus isolated from the 1-5 V input of the PLC 210) unless the individual field device 230 is addressed by the PLC 210. However, the power and ground signals from the bus 220 that provide power and ground to the coupler box 300 may pass through the coupler box 300 to the field device 230 to enable the field device 230 to operate.

Figure 3:
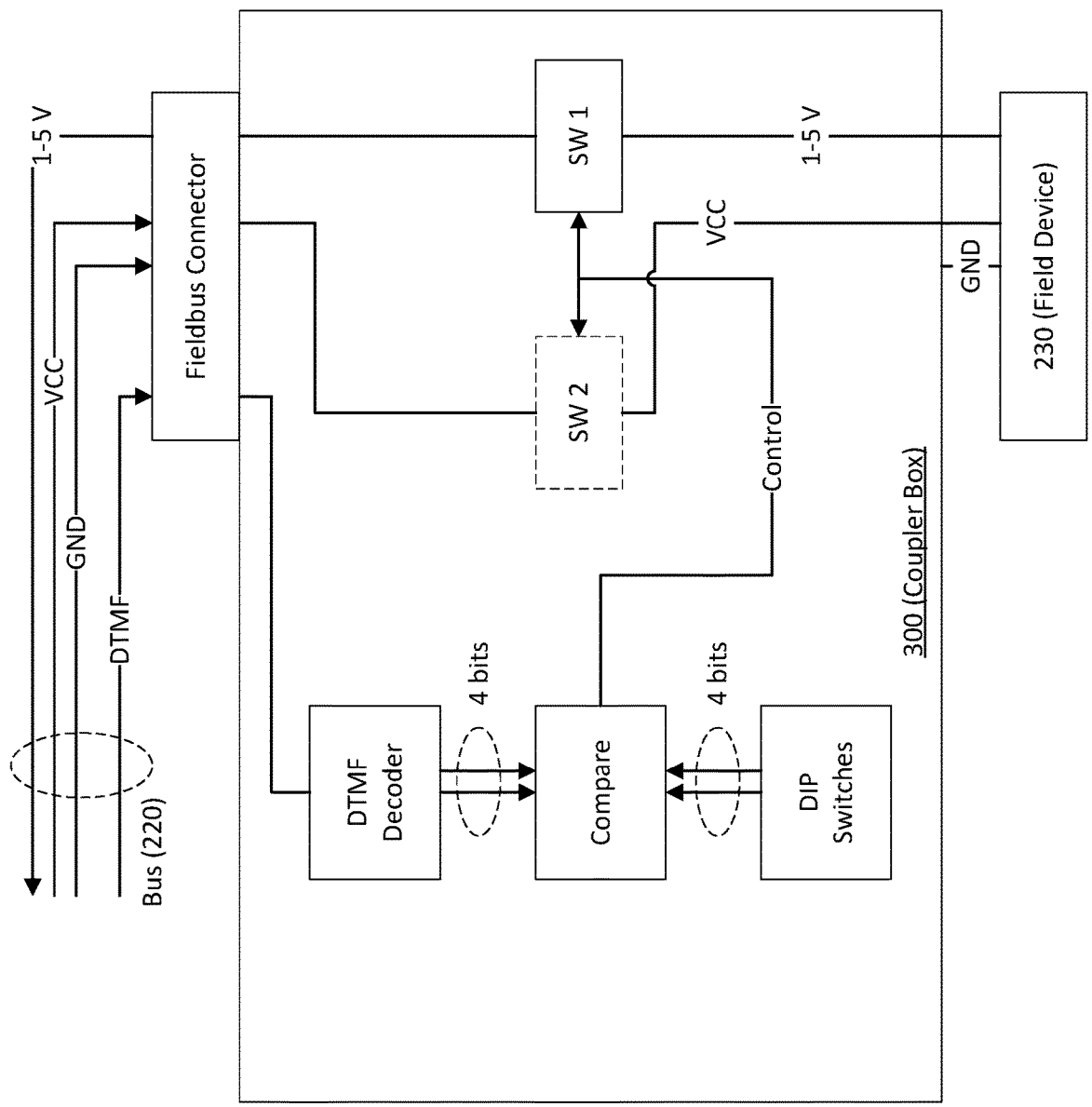
FIG. 3 shows a coupler box according to an embodiment of the present disclosure.

An embodiment of a coupler box 300 according to the present disclosure may be seen in FIG. 3. The bus-side connections for the coupler box 300 may be as follows: one signal may be a DTMF input; one signal may be ground (GND); one signal may be a voltage supply (VCC); and finally one signal may be a 1-5 V output to the field bus 220 which is carried by the field bus 220 to an input circuit of the PLC 210.

The device-side connections for the coupler box 300 may be as follows: one signal may be ground (GND) to the field device 230; one signal may be a voltage supply (VCC) to the field device 230; and one signal may be a 1-5 V analog voltage from the field device 230.

The coupler box 300 may include a DTMF decoder embodied to decode the DTMF signal provided by the PLC 210 via the bus 220. The DTMF decoder may be connected with the DTMF input of the coupler box 300 and may continually listen for any dual-tone signal on the DTMF line of the bus 220. The DTMF decoder may decode such DTMF signal as a numeric value from 0 to 15.

The coupler box 300 may further include a dual in-line package (DIP) switch having four single-pole, single-throw switches. The particular implementation of the DIP switch is not important; it may be embodied with slider switches, or it may be embodied as a rotary switch. However, the DIP switch may be configured to set a binary value from 0000 to 1111, or in base 10, a number from 0 to 15, inclusive.

The DIP switch of the coupler box 300 may be accessible from outside of the coupler box 300, or may be easily accessible by the removal of a cover plate, etc. The DIP switches thus may be easily settable by a user so that each coupler box 300 attached to the bus 220 may be set to encode a unique value with its DIP switches. That is, each coupler box 300 connected with the bus 220 may have a unique address on the bus 220 encoded by the DIP switches.

The coupler box 300 may further include a comparator circuit to compare the value output from the DTMF decoder (i.e., a value from 0 to 15) with the value set by the DIP switches (i.e., also a value from 0 to 15). When the decoded value of the DTMF signal sent by the PLC 210 matches that value encoded by the coupler box's DIP switches, the coupler box 300 is thereby addressed, or selected, by the PLC 210. When the decoded value of the DTMF signal does not match the value encoded by the coupler box's DIP switches, that coupler box 300 is therefore not selected by the PLC 210.

As seen in the embodiment of the coupler box 300 as shown in FIG. 3, the coupler box 300 may include a first single-pole, single-throw switch SW1 that is normally open. The normally open switch SW1 may be electrically disposed between the 1-5 V input (from the field device 230) and the 1-5 V output (to the PLC 210) of the coupler box 300. A control signal to close the normally open first switch SW1 may be provided by the comparator circuit. When the coupler box 300 is selected by the PLC 210 by the PLC 210 transmitting the address of that coupler box 300 on the DTMF signal of the bus 210, the comparator circuit may assert the control signal to the first switch SW1 to close the first switch SW1 and therefore electrically connect the 1-5 V output of the field device 230 with the 1-5 V input of the PLC 210.

When the coupler box 300 is not selected by the PLC 210, the comparator circuit may not assert the control signal to the first switch SW1, and the first switch SW1 may remain open. Thus the 1-5 V output of the field device 230 may be isolated from the 1-5 V input of the PLC 210.

The coupler box 300 may further, optionally, include a second single-pole, single-throw switch SW2 that is normally open. The normally open second witch SW2 may be electrically disposed between the VCC input (from the bus 220) and the VCC output (to the field device 230) of the coupler box 300. The control signal that the comparator circuit may provide to the first switch SW1 may also be provided to the second switch SW2. The closing of the second switch SW2 by the selection of the coupler box 300 by the PLC 210 may thus provide electrical power to the field device 230. However, when the coupler box 300 is not selected by the PLC 210 the second switch SW2 may remain open and no electrical power may be supplied to the field device 230.

This optional second switch SW2 provides to the operators of the process automation system 200 the option to keep a field device 230 powered off unless and until that field device 230 is needed. In embodiments of the coupler box 300 without the optional second switch SW2, the electrical connection between the VCC input and the VCC output of the coupler box 300 may always be present.

Because the coupler box 300 disconnects the 1-5 V signal, and optionally VCC, between the bus 220 and the field device 230 when that particular coupler box 300 is not addressed by the PLC 210, the PLC 210 must continually output the DTMF signal while a particular coupler box 300 is selected by the PLC 210. Otherwise, the absence of the DTMF signal, or the encoding of a different address in the DTMF signal, may cause the coupler box 300 to disconnect the 1-5 V signal, and optionally VCC, between the field device 230 and the bus 220.

In a process automation system 200 according to an embodiment of the present disclosure, a single multidrop bus having one or more coupler boxes 300 (each with an associated field device 230) may be connected with a single analog voltage input of the PLC 210. In the context of the present disclosure, up to 16 coupler boxes 300 (and associated field devices 230) may be connected with the single analog voltage input of the PCL 210. Each of the coupler boxes 300 may have a unique address from 0 to 15, and therefore the PLC 210 may address at most one coupler box 300 with the dual-tone, multiple-frequency signal. This configuration therefore is akin to a multiplexor that selects one input from an array of several, and routes that selected input to the multiplexor's output.

In the process automation system 200, the PLC 210 may be configured to read the 1-5 V analog output voltage of a field device 230 in the following manner. As a first step, the PLC 210 may output a DTMF signal that matches the address set by the DIP switch within the coupler box 300 that attaches the field device 230 to the bus 220. The PLC 210 may then pause briefly (while continuing to output the DTMF signal) to allow the coupler box 300 to decode the DTMF signal and compare the DTMF signal with the DIP switch address setting of the coupler box 300. The PLC 210 may then read the field device's 1-5 V analog signal from the bus 210. The PLC 210 may continue to output the DTMF signal onto the bus 210 as long as the PLC 210 needs access to the field device's 1-5 V analog output signal.

The PLC 210 may read the 1-5 V analog output signals of other fields devices in a similar manner. However, before sending the DTMF signal encoding the address of a second field device 230, the PLC 210 may first stop sending any DTMF signal on the bus 220 and briefly pause to allow the first coupler box 300 to disconnect its field device's 1-5 V analog signal from the bus 210. Additionally, for those embodiments of the coupler box 300 having a second SPST switch SW2 that connects and disconnects VCC, the PLC 210 may additionally pause after sending (but continuing to send) the DTMF signal encoding the second coupler box's address so that the field device 230 connected with that second coupler box 300 may have time to power-on.

What is claimed:

1. A coupler box, comprising:
   a bus-side connector including: a ground (GND) terminal; an input voltage (VCC) terminal; a 1-5 volt (V) output terminal; and a dual-tone, multiple-frequency (DTMF) input terminal;
   a field-device side connector, including: a GND terminal; a VCC output terminal; and a 1-5 V input terminal;
   a first single-pole, single-throw (SPST) switch electrically disposed between the 1-5 V output terminal and the 1-5 V input terminal, wherein the first SPST switch is normally open;
   a DTMF decoder having an input connected with the DTMF input terminal;
   a dual in-line package (DIP) switch configured to set a binary value from 0000b to 1111b, inclusive; and
   a comparator circuit having:
     a first input connected with an output of the DTMF decoder;
     a second input connected with the DIP switch; and
     an output signal connected with a control input of the first SPST switch,
   wherein the comparator circuit is configured to compare a decoded DTMF signal output by the DTMF decoder with the binary value set by the DIP switch, and
   wherein the comparator circuit is further configured to assert its control output to close the first SPST switch when the decoded DTMF signal equals the binary value set by the DIP switch, thus electrically connecting the 1-5 V output terminal with the 1-5 V input terminal.

2. The coupler box of claim 1, further comprising:
   a second SPST switch, wherein the second SPST switch is electrically disposed between the input VCC terminal and the output VCC terminal, and the second SPST switch is normally open,
   wherein the output signal of the comparator circuit is further connected with a control input of the second SPST switch, and
   wherein the comparator circuit is further configured to close the second SPST switch when the decoded DTMF signal equals the binary value set by the DIP switch, thus electrically connecting the VCC input terminal with the VCC output terminal.

3. A process automation system, comprising:
   a central controller, including:
     a processor and a memory;
     a supply voltage (VCC) output;
     a ground (GND) terminal;
     a 1-5 volt (V) signal input terminal; and
     a dual-tone, multiple-frequency (DTMF) encoder configured to output on a DTMF output terminal an electrical dual-tone signal encoding a value from 0 to 15, inclusive;
   a four-conductor, multi-drop bus, wherein:
     a first conductor of the bus is connected with the VCC output of the central controller;
     a second conductor of the bus is connected with the GND terminal of the central controller;
     a third conductor of the bus is connected with the 1-5 V input terminal of the central controller; and
     a fourth conductor of the bus is connected with the DTMF output terminal of the central controller;
   a first coupler box, including:
     a bus-side connector including: a ground (GND) terminal; an input voltage (VCC) terminal; a 1-5 volt (V) output terminal; and a dual-tone, multiple-frequency (DTMF) input terminal;
     a field-device side connector, including: a GND terminal; a VCC output terminal; and a 1-5 V input terminal;
     a first single-pole, single-throw (SPST) switch electrically disposed between the 1-5 V output terminal and the 1-5 V input terminal, wherein the first SPST switch is normally open;
     a DTMF decoder having an input connected with the DTMF input terminal;
     a dual in-line package (DIP) switch configured to set a binary value from 0000b to 1111b, inclusive; and
     a comparator circuit having:
       a first input connected with an output of the DTMF decoder;
       a second input connected with the DIP switch; and
       an output signal connected with a control input of the first SPST switch,
     wherein the comparator circuit is configured to compare a decoded DTMF signal output by the DTMF decoder with the binary value set by the DIP switch, and
     wherein the comparator circuit is further configured to assert its control output to close the first SPST switch when the decoded DTMF signal equals the binary value set by the DIP switch, thus electrically connecting the 1-5 V output terminal with the 1-5 V input terminal,
     wherein the bus-side GND terminal is connected with the second conductor of the bus, the bus-side VCC terminal is connected with the first conductor of the bus, the 1-5 V output terminal is connected with the third conductor of the bus, and the DTMF input terminal is connected with the fourth conductor of the bus; and a first field device, including:
- a VCC input;
- a GND terminal; and
- a 1-5 V signal output terminal,
  wherein the VCC input is connected with VCC output terminal of the first coupler box, the GND terminal is connected with the bus-side GND terminal of the first coupler box, and the 1-5 V signal output terminal is connected with the 1-5 V input terminal of the first coupler box, wherein the central controller is configured to output a DTMF signal via the DTMF output terminal, wherein the central controller is further configured to input a 1-5 V signal from the first field device by:
- outputting a DTMF signal that matches an address of the first coupler box encoded by the DIP switch of the first coupler box; and
- reading the 1-5 V signal from the third conductor of the bus.

4. The process automation system of claim 3, further comprising:
- a second coupler box embodied identically to the first coupler box, wherein:
  - the bus-side GND terminal of the second coupler box is connected with the second conductor of the bus,
  - the bus-side VCC terminal of the second coupler box is connected with the first conductor of the bus,
  - the 1-5 V output terminal of the second coupler box is connected with the third conductor of the bus, and
  - the DTMF input terminal of the second coupler box is connected with the fourth conductor of the bus; and
- a second field device, including:
  - a VCC input;
  - a GND terminal; and
  - a 1-5 V signal output terminal,
    wherein the VCC input of the second field device is connected with VCC output terminal of the second coupler box, the GND terminal of the second field device is connected with the bus-side GND terminal of the second coupler box, and the 1-5 V signal output terminal of the second field device is connected with the 1-5 V input terminal of the second coupler box, wherein an address encoded by the DIP switch of the second coupler box differs from the address encoded by the DIP switch of the first coupler box, wherein the central controller is further configured to input a 1-5 V signal from the second field device by:
- outputting a DTMF signal that matches the address encoded by the DIP switch of the second coupler box; and
- reading the 1-5 V signal from the third conductor of the bus.

5. The process automation system of claim 3,
wherein the first coupler box further includes a second single-pole, single-throw (SPST) switch, wherein the second SPST switch is electrically disposed between the VCC input terminal and the VCC output terminal, wherein the second SPST switch is normally open, wherein the output signal of the comparator circuit is further connected with a control input of the second SPST switch, wherein, after outputting the DTMF signal that matches the address encoded by the DIP switch of the first coupler box; the central controller is further configured to wait for the first field device to power up before the central controller reads the 1-5 V signal from the third conductor of the bus.

* * * * *